US012671377B2

(12) United States Patent
Baharmast et al.

(10) Patent No.: US 12,671,377 B2
(45) Date of Patent: Jun. 30, 2026

(54) COMPARATOR WITH REDUCED POWER CONSUMPTION

(71) Applicant: NORDIC SEMICONDUCTOR ASA, Trondheim (NO)

(72) Inventors: Aram Baharmast, Oulu (FI); Jarmo Väänänen, Oulu (FI)

(73) Assignee: NORDIC SEMICONDUCTOR ASA, Trondheim (NO)

( * ) Notice: Subject to any disclaimer, the term of this patent is extended or adjusted under 35 U.S.C. 154(b) by 449 days.

(21) Appl. No.: 18/516,003

(22) Filed: Nov. 21, 2023

(65) Prior Publication Data

US 2024/0178806 A1     May 30, 2024

(30) Foreign Application Priority Data

Nov. 25, 2022     (FI) ...................................... 20226055

(51) Int. Cl.
H03F 3/45 (2006.01)
H03F 1/02 (2006.01)
H03K 5/22 (2006.01)

(52) U.S. Cl.
CPC ....... H03F 3/4521 (2013.01); H03F 3/45273 (2013.01); H03F 3/4565 (2013.01); *H03F 2203/45644* (2013.01); *H03F 2203/45658* (2013.01)

(58) Field of Classification Search
CPC .. H03F 3/4521; H03F 3/45273; H03F 3/4565; H03F 2203/45644; H03F 2203/45658; H03F 3/45183
USPC ................................................. 330/252–261
See application file for complete search history.

(56) References Cited

U.S. PATENT DOCUMENTS

| | | | |
|---|---|---|---|
| 10,574,221 B2 * | 2/2020 | Wang | ................... H03K 5/2481 |
| 2002/0060607 A1 | 5/2002 | Forejt | |
| 2007/0069933 A1 | 3/2007 | Clara et al. | |

FOREIGN PATENT DOCUMENTS

JP        2006332731 A    12/2006

OTHER PUBLICATIONS

Office Action for FI20226055, dated Jun. 1, 2023, 7 pages.

* cited by examiner

*Primary Examiner* — Hieu P Nguyen
(74) *Attorney, Agent, or Firm* — Nixon & Vanderhye PC

(57)        ABSTRACT

According to an aspect, there is provided a comparator comprising input terminals, first, second and third biasing current sources configured to output first, second and third biasing currents, an input circuit driven by the first biasing current source and comprising an amplification circuit and a load circuit configured to provide positive feedback for the amplification circuit, first and second current mirroring circuits for forming, with the input circuit, first and second current mirrors producing first and second current mode signals, first and second current-controlled driver circuits configured to be controlled by the second and third biasing currents, respectively, and the first and second current mode signals, respectively, a latch circuit comprising first and second cross-coupled complementary metal-oxide semiconductor transistors acting as a latch having substantially rail-to-rail output voltage swing and being driven, respectively, by the first and second current-controlled driver circuits and an output circuit implementing a current starved inverter.

14 Claims, 3 Drawing Sheets

COMPARATOR WITH REDUCED POWER CONSUMPTION

This application claims priority to FI patent application No. 20226055 filed Nov. 25, 2022, the entire contents of which is hereby incorporated by reference.

TECHNICAL FIELD

Various example embodiments relate to comparators.

BACKGROUND

A comparator is an electronic circuit for comparing two input signals (i.e., two voltages or currents) and outputting a digital (i.e., binary) signal indicating which one of the two input signals is larger. A comparator acts effectively as a high gain differential amplifier. The gain should be large enough so that a very small difference between the input voltages/currents will saturate the output and thus the output signal will be in either a low logic voltage band or a high logic voltage band.

In many applications, it is critical that the power consumption of a comparator is as small as possible. Ideally, a comparator should consume power only when it is triggered (i.e., when the output of the comparator changes). However, in practice, power is often consumed also when the comparator is close to triggering (i.e., when the input voltages of the comparator are almost equal) which is problematic from the point of view of implementing a comparator with minimized power consumption. Such applications may include, for example, use of comparators in direct current to direct current (DC-DC) converters operating using an ultra-low power (ULP) operating mode.

BRIEF DESCRIPTION

According to a first aspect, there is provided a comparator comprising positive and negative input terminals;

first, second and third biasing current sources configured to output first, second and third biasing currents;

an input circuit driven by the first biasing current source, wherein the input circuit comprises an amplification circuit coupled to the positive and negative input terminals and a load circuit configured to provide positive feedback for the amplification circuit to enable hysteresis;

first and second current mirroring circuits for forming, with the input circuit, first and second current mirrors producing first and second current mode signals;

first and second current-controlled driver circuits configured to be controlled by the second and third biasing currents, respectively, and further by the first and second current mode signals, respectively;

a latch circuit comprising first and second cross-coupled complementary metal-oxide semiconductor, CMOS, transistors acting together as a latch having substantially rail-to-rail output voltage swing and being driven, respectively, by the first and second current-controlled driver circuits; and an output circuit implementing a current starved inverter for limiting a shoot-through current from a positive voltage supply to a negative voltage supply, wherein positive and negative inputs of the output circuit are coupled, respectively, to output terminals of the latch circuit.

The first aspect provides the technical effect that a comparator operation is enabled for input signals fed to the positive and negative input terminals.

The first aspect provides the advantage of low power consumption (or in particular low dynamic power consumption) even in the cases where input transitions are slow (i.e., the slew rate of the input signals is low). The comparator according to the first aspect may be optimizable for a given desired input slew rate. This way the dynamic power consumption of the comparator may be maintained at a low level while not significantly affecting the other fundamental characteristics of the comparator (i.e., speed, delay and/or output rise time).

Embodiments are defined in the dependent claims. The scope of protection sought for various embodiments is set out by the independent claims.

The embodiments and features, if any, described in this specification that do not fall under the scope of the independent claims are to be interpreted as examples useful for understanding various embodiments of the invention.

BRIEF DESCRIPTION OF DRAWINGS

In the following, example embodiments will be described in greater detail with reference to the attached drawings, in which.

DETAILED DESCRIPTION OF SOME EMBODIMENTS

The following embodiments are only presented as examples. Although the specification may refer to "an", "one", or "some" embodiment(s) and/or example(s) in several locations of the text, this does not necessarily mean that each reference is made to the same embodiment(s) or example(s), or that a particular feature only applies to a single embodiment and/or example. Single features of different embodiments and/or examples may also be combined to provide other embodiments and/or examples.

The following general definitions may apply for the following discussion.

A diode-connected transistor may be defined to be a transistor whose terminals have been connected to each other so as to create a two-terminal rectifying device (i.e., a diode) out of a three-terminal transistor. Namely, a diode-connected transistor may be made, for example, by connecting the gate and drain of a metal-oxide-semiconductor field-effect transistor (MOSFET). A characteristic of diode-connected transistors is that they are always in the saturation region for MOSFETs and JFETs, and in the active region for BJTs.

A current mirror may be defined to be a circuit designed to copy a current through one active device by controlling the current in another active device of a circuit while keeping the output current constant regardless of loading. An ideal current mirror is essentially an ideal inverting current amplifier that reverses the current direction. A current mirror may be implemented using multiple different circuit topologies such as a Widlar mirror and a Wilson mirror.

A current starved inverter may be defined to be an inverter circuit configured to receive an input voltage and to generate an inverted output voltage with a constant slew rate.

As described above, a comparator is an electronic circuit for comparing two input signals (i.e., two voltages or currents) and outputting a digital (i.e., binary) signal indicating which one of the two input signals is larger. Comparators may exhibit internal hysteresis desensitizing them from input noise. A comparator normally changes its output state when the voltage between its inputs crosses through approximately zero volts. Small voltage fluctuations due to noise, practically always present on the inputs of a comparator, may cause undesirable rapid changes between the two output states when the input voltage difference is near zero volts. A small hysteresis of a few millivolts may be integrated into the comparator in order to prevent this output oscillation so that the output retains its value until the inputs change sufficiently to trigger a change. Thus, instead of a single switching point, a comparator with hysteresis employs two switching points: one for rising voltages, and one for falling voltages. The difference between the higher-level trip value (VTRIP+) and the lower-level trip value (VTRIP−) equals the hysteresis voltage (VHYST).

Figure 1:
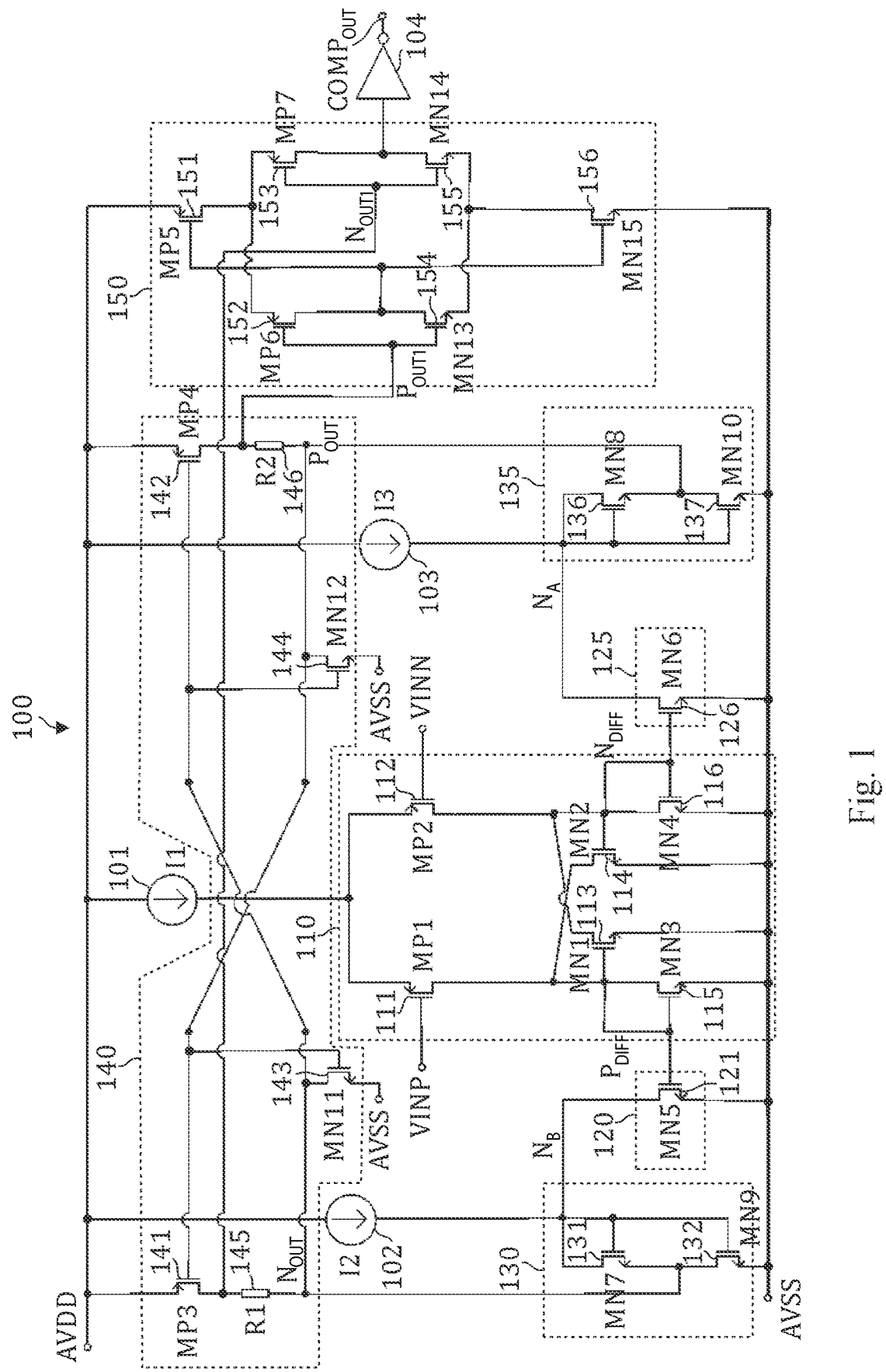
FIG. 1 illustrates a comparator according to embodiments.

FIG. 1 illustrates a comparator 100 according to an embodiment for providing low power consumption. The comparator 100 may be specifically a MOSFET-based comparator (though, in other embodiments, different transistor technology may be employed).

For facilitating reading of the following description of the comparator 100 of FIG. 1, it should be noted that, in the following, first and second source/drain terminals of any transistor correspond, respectively, to top and bottom source/drain terminals as shown in FIG. 1.

The comparator 100 comprises a plurality of circuits (equally called stages) connecting positive and negative input terminals VINP & VINN of the comparator 100 to an output terminal $COMP_{OUT}$ of the comparator 100. Namely, the comparator 100 comprises an input circuit 110, first and second current mirroring circuits 120, 125, first and second current-controlled driver circuits 130, 135, a latch circuit 140 and an output circuit 150. In addition to said plurality of circuits, the comparator 100 comprises first, second and third biasing current sources 101, 102, 103 and, at least in some embodiments, an inverter 104. The comparator 100 is coupled to the nodes AVDD and AVSS which correspond to positive and negative power supplies (equally called positive and negative voltage supplies) providing, respectively, a positive supply voltage VDD and a negative supply voltage VSS (i.e., the "ground" voltage). The negative power supply AVSS may correspond, in some cases, simply to the ground.

In the following the operation of the individual circuits/stages/elements 101 to 104, 110, 120, 125, 130, 135, 140, 150 is discussed in general and in detail with reference to the particular implementation of FIG. 1.

The first, second and third biasing current sources 101, 102, 103 are configured to provide or output first, second and third biasing currents $I_1$, $I_2$ & $I_3$, respectively. In some embodiments, the second and third biasing currents produced by the second and third biasing current sources 102, 103 are equal (i.e., $I_2=I_3$) while the first biasing current produced by the first biasing current source 101 may not (necessarily) be equal to the second and third biasing currents (i.e., $I_1 \neq I_2=I_3$).

The input circuit 110 is coupled to the positive and negative input terminals (VINP & VINN) of the comparator 100. Moreover, the input circuit 110 is driven (i.e., biased) by the first biasing current source 101. The input circuit 110 may be seen to comprise two subcircuits: an input amplification circuit coupled to the positive and negative input terminals (here comprising elements 111, 112) and a load circuit (cross-)coupled to the input amplification circuit (here comprising elements 113 to 116). The load circuit may comprise, for example, a pair of load transistors 113, 114 cross-coupled to the amplification circuit (i.e., to elements 111, 112) and a pair of diode-connected transistors 115, 116 arranged, respectively, in parallel with the pair of cross-coupled load transistors. The load circuit may be configured to provide positive feedback (i.e., a feedback factor >1). Thus, the input circuit 110 of the comparator 100 exhibits (small) internal hysteresis.

Referring more specifically to FIG. 1, the amplification (sub)circuit of the input circuit 110 comprises first and second p-channel metal-oxide semiconductor (PMOS) transistors 111, 112 (MP1 & MP2). Gates of the first and second PMOS transistors 111, 112 are coupled, respectively, to the positive and negative inputs (VINP & VINN) and first source/drain terminals of the first and second PMOS transistors 111, 112 are coupled to the first biasing current source 101. During the (nominal) operation of the comparator 100, the first source/drain terminals of the first and second PMOS transistors 111, 112 may specifically act as sources and the second source/drain terminals of the first and second PMOS transistors 111, 112 may specifically act as drains, as illustrated also in FIG. 1.

Further referring more specifically to FIG. 1, the load circuit of the input circuit 110 comprises first and second n-type metal-oxide-semiconductor (NMOS) transistors 113, 114 (MN1 & MN2). Gates of the first and second NMOS transistors 113, 114 correspond to (or are coupled to) the positive and negative output terminals of the input circuit 110 and the first source/drain terminals of the first and second NMOS transistors 111, 112 are coupled, respectively, to second source/drain terminals of the second and first PMOS transistors. The load circuit of the input circuit 110 further comprises third and fourth NMOS transistors 115, 116 (MN3 & MN4). The third and fourth NMOS transistors 115, 116 are diode-connected. In other words, gates of the third and fourth NMOS transistors 115, 116 are coupled, respectively, to first source/drain terminals of the third and fourth NMOS transistors 115, 116. The gates (and thus also the first source/drain terminals) of the third and fourth NMOS transistors 115, 116 are further coupled to the gates of the first and second NMOS transistors 113, 114, respectively, and consequently also to the drains of the first and second PMOS transistors 111, 112, respectively. The gates of the third and fourth NMOS transistors 115, 116 also correspond, respectively, to positive and negative output terminals ($P_{DIFF}$ & $N_{DIFF}$) of the input circuit 110. The second source/drain terminals of the third and fourth NM OS transistors are assumed to be connected, during the operation of the comparator 100, to the negative power supply AVSS. During the (nominal) operation of the comparator 100, the first source/drain terminals of the first, second, third and fourth NMOS transistors 113 to 116 may specifically act as drains and the second source/drain terminals of the first, second, third and fourth NMOS transistors 113 to 116 may specifically act as sources, as illustrated also in FIG. 1.

The first and second current mirroring circuits 120, 125 form, with the pair of diode-connected transistors (i.e., the third and fourth NMOS transistors 115, 116 in FIG. 1) of the load circuit of the input circuit 110, first and second current mirrors producing first and second current mode signals. Said first and second current mirrors may be basic two-transistor current mirrors, as shown in FIG. 1, though, in other embodiments, other current mirror topologies may be employed (e.g., Widlar mirrors or Wilson mirrors). It should be noted that use of another current mirror topology for the first and/or second current mirroring circuits 120, 125 may necessitate, at least in some cases, changes also to the input circuit 110. The first and second current mirroring circuits 120, 125 may have the same circuit topology.

Referring more specifically to FIG. 1, the first and second current mirroring circuits 120, 125 comprise, respectively, fifth and sixth NMOS transistors 121, 126 (MN5 & MN6) for producing, respectively, the first and second current mode signals. Gates of the fifth and sixth NMOS transistors 121, 126 are coupled, respectively, to the positive and negative output terminals ($P_{DIFF}$ & $N_{DIFF}$) of the input circuit 110. The first source/drain terminals (i.e., terminals $N_B$ & $N_A$) of the fifth and sixth NMOS transistors 121, 126 provides the first and second current mode signals, respectively. The second source/drain terminals of the fifth and sixth NMOS transistors 121, 126 are assumed to be connected, during the operation of the comparator 100, to the negative power supply AVSS.

In some embodiments, the input circuit 110 and the first and second current mirroring circuits 120, 125 are specifically configured so that when a (slow) transition signal is applied to the inputs of the comparator 100, voltage at node $N_A$ is forced down before voltage at node $N_B$ rises up. This is achieved by configuring the input circuit 110 so that it provides internal hysteresis of sufficiently high level (i.e., so that the feedback factor is at least larger than one) and the first and second current mirroring circuits 120, 125 and the input circuit 110 so that sufficiently high mirroring factor is implemented by the first and second current mirrors.

The first and second current-controlled driver circuits 130, 135 are driver circuits which are configured (and arranged) so as to be controlled by the second and third biasing currents outputted by the second and third biasing current sources 102, 103, respectively, and by the first and second current mode signals outputted by the first and second current mirroring circuits 120, 125, respectively. The first and second current-controlled driver circuits 130, 135 are used for driving the latch circuit 140. The first and second current-controlled driver circuits 130, 135 may have the same circuit topology. The first and second current-controlled driver circuits 130, 135 may be equally called first and second current-mode driver circuits.

Referring more specifically to FIG. 1, the first current-controlled driver circuit 130 comprises seventh and ninth NMOS transistors 131, 132 (MN7 & MN9) forming a cascade. Gates of the seventh and ninth NMOS transistors 131, 132 are both coupled to the first source/drain terminal of the fifth NMOS transistor 121 (i.e., $N_B$) providing the first current mode signal, to a first source/drain terminal of the seventh NMOS transistor 131 and to the second biasing current source 102. Moreover, a second source/drain terminal of the seventh NMOS transistor 131 and a first source/drain terminal of the ninth NMOS transistor 132 are coupled (to each other) and correspond to (or are or coupled to) an output terminal of the first current-controlled driver circuit 130. The second source/drain terminal of the ninth NMOS transistors 132 is assumed to be connected, during the operation of the comparator 100, to the negative power supply AVSS. During the (nominal) operation of the comparator 100, the first source/drain terminals of the seventh and ninth NMOS transistors 131, 132 may specifically act as drains and the second source/drain terminals of the seventh and ninth NMOS transistors 131, 132 may specifically act as sources, as illustrated also in FIG. 1.

Referring more specifically to FIG. 1, the second current-controlled driver circuit 135 comprises eighth and tenth NMOS transistors 136, 137 (MN8 & MN10) forming a cascade. Gates of the eighth and tenth NMOS transistors 136, 137 are both coupled to a first source/drain terminal of the sixth NMOS transistor 126 (i.e., $N_A$) providing the second current mode signal, to a first source/drain terminal of the eighth NMOS transistor 136 and to the third biasing current source 103. Moreover, a second source/drain terminal of the eighth NMOS transistor 136 and a first source/drain terminal of the tenth NMOS transistor 137 are coupled (to each other) and correspond to (or are or are coupled to) an output terminal of the second current-controlled driver circuit 135. The second source/drain terminal of the tenth NMOS transistors 137 is assumed to be connected, during the operation of the comparator 100, to the negative power supply AVSS. During the (nominal) operation of the comparator 100, the first source/drain terminals of the eighth and tenth NMOS transistors 136, 137 may specifically act as drains and the second source/drain terminals of the eighth and tenth NMOS transistors 136, 137 may specifically act as sources, as illustrated also in FIG. 1.

The latch circuit 140 comprises first and second cross-coupled complementary metal-oxide semiconductor (CMOS) transistors acting together as a (CMOS) latch having substantially rail-to-rail output voltage swing. The expression "substantially rail-to-rail output voltage swing" means here that the output voltage swings (or is capable of swinging) substantially from the positive supply voltage (VDD) to the negative supply voltage (VSS). Specifically, the expression "substantially rail-to-rail output voltage swing" may mean voltage swing at least from a*VSS to b*VDD or from VSS=0 to b*VDD, where a and b are positive real numbers with a being larger than 1 and b being smaller than one. For example, a may be 1.1 or 1.05 and/or b may be 0.9 or 0.95. The first and second cross-coupled CMOS transistors are driven, respectively, by the first and second current-controlled driver circuits 130, 135 (i.e., the first and second cross-coupled CMOS transistors are coupled, respectively, to the output terminals of the first and second current-controlled driver circuits 130, 135). Said first and second cross-coupled CMOS transistors which are cross-coupled with each other comprise, respectively, at least PMOS/NMOS transistor pairs 141, 143 & 142, 144. The latch circuit 140 may be specifically coupled to the first and second current-controlled driver circuits 130, 135 so that when an output terminal ($N_{OUT1}/P_{OUT1}$) of the latch circuit 140 is driven to the positive supply voltage VDD, the corresponding PMOS transistor 141, 142 comprised in the first or second CMOS transistor will be driven off i.e., no current will flow through the PMOS transistor 141, 142 in that case.

Referring more specifically to FIG. 1, the latch circuit 140 comprises third and fourth PMOS transistors 141, 142 (MP3 & MP4) and eleventh and twelfth NMOS transistors 143, 144 (MN11 & MN12). The third PMOS transistor 141 and the eleventh NMOS transistor 143 (and optionally a first resistor 145 R1) form together a first CMOS transistor, and the fourth PMOS transistor 142 and the twelfth NMOS transistor 144 (and optionally a second resistor 146 R2) form together a second CMOS transistor. Gates of the third and fourth PMOS transistors 141, 142 are coupled, respectively, to output terminals of the first and second current-controlled driver circuits 130, 135 and, optionally via the first and second resistors 145, 146, to second source/drain terminals of the fourth and third PMOS transistors 142, 141. Gates of the eleventh and twelfth NMOS transistors 143, 144 are coupled, respectively, to the gates of the third and fourth PMOS transistors 141, 142 and to first source/drain terminals of the twelfth and eleventh NMOS transistors 143, 144. Thus, the first and second CMOS transistor are effectively cross-coupled, as mentioned above.

In some more general embodiments, the first and second resistors 145, 146 may be replaced by first and second impedance circuits. The first and second impedance circuits may comprise, respectively, at least the first and second resistors 145, 156.

The first source/drain terminals of the eleventh and twelfth NMOS transistors 143, 144 correspond to (or are coupled to) negative and positive output terminals ($N_{OUT}$ & $P_{OUT}$) of the first and second current-controlled driver circuits 130, 135, respectively. The second source/drain terminals of the third and fourth PMOS transistors 141, 142 correspond to (or are or are coupled to) negative and positive output terminals ($N_{OUT1}$ & $P_{OUT1}$) of the latch circuit 140, respectively.

The first source/drain terminals of the third and fourth PMOS transistors 141, 142 may be assumed to be connected, during the operation of the comparator 100, to the positive power supply AVDD. Moreover, the second source/drain terminals of the eleventh and twelfth NMOS transistors 143, 144 may be assumed to be connected, during the operation of the comparator 100, to the negative power supply AVSS.

During the (nominal) operation of the comparator 100, the first source/drain terminals of the third and fourth PMOS transistors 141, 142 may specifically act as sources and the second source/drain terminals of the third and fourth PMOS transistors 141, 142 may specifically act as drains, as illustrated also in FIG. 1. Further, during the (nominal) operation of the comparator 100, the first source/drain terminals of the eleventh and twelfth NMOS transistors 143, 144 may specifically act as drains and the second source/drain terminals of the eleventh and twelfth NMOS transistors 143, 144 may specifically act as sources, as illustrated also in FIG. 1.

In some embodiments, the values of the first and second resistors 145, 146 may be equal (i.e., R1=R2 may apply). The first resistor (R1) 145 may defined so that the sum of R1 and a drain-source ON resistance $R_{dsOn}$ of the third PMOS transistor (MP3) 141 is larger than a minimum drain-source on resistance $R_{dsOn}$ of the ninth NMOS transistors (MN9) 132. Additionally or alternatively, the second resistor (R2) 146 may defined so that the sum of R2 and a drain-source on resistance $R_{dsOn}$ of the fourth PMOS transistor (MP4) 142 is larger than a minimum drain-source ON resistance $R_{dsOn}$ of the tenth NMOS transistor (MN10) 137.

The output circuit 150 may be configured to implement a current starved inverter for limiting a shoot-through current from the positive voltage supply to the negative voltage supply (i.e., from AVDD to AVSS). Thus, the output circuit 150 may be equally called a current starved inverter circuit 150. The positive and negative inputs of the output circuit 150 are coupled, respectively, to positive and negative output terminals ($P_{OUT}$ and $N_{OUT}$) of the latch circuit 140.

Referring more specifically to FIG. 1, the output circuit 150 comprises a fifth PMOS transistor 151 (MP5), a sixth PMOS transistor 152 (MP6), a seventh PMOS transistor 153 (MP7), a thirteenth NMOS transistor 154 (MN13), a fourteenth NMOS transistor 155 (MN14) and a fifteenth NMOS transistor 156 (MN15).

The transistors 151 to 156 of the output circuit 150 are coupled to each other as follows:

a first source/drain terminal of the sixth PMOS transistor 152 is coupled to a second source/drain terminal of the fifth PMOS transistor 151, a second source/drain terminal of the sixth PMOS transistor 152 is coupled to a gate of the fifth PMOS transistor 151, a first source/drain terminal of the seventh PMOS transistor 153 is coupled to the second source/drain terminal of the fifth PMOS transistor 151 (and thus also to the first source/drain terminal of the sixth PMOS transistor 152), a gate of the thirteenth NMOS transistor 154 is coupled to a gate of the sixth PMOS transistor 152, a first source/drain terminal of thirteenth NMOS transistor 154 is coupled to a second source/drain terminal of the sixth PMOS transistor 152 (and thus also to the gate of the fifth PMOS transistor 151), a gate of the fourteenth NMOS transistor 155 is coupled to a gate of the seventh PMOS transistor 153, a first source/drain terminal of fourteenth NMOS transistor 155 is coupled to the second source/drain terminal of the seventh PMOS transistor 153, a second source/drain terminal of fourteenth NMOS transistor 155 is coupled to a second source/drain terminal of the thirteenth NMOS transistor 154, a gate of the fifteenth NMOS transistor 156 is coupled to the gate of the fifth PMOS transistor 151 (and thus also to the second source/drain terminal of the sixth PMOS transistor 152 and to the first source/drain terminals of the thirteenth NMOS transistor 154) and a first source/drain terminal of fifteenth NMOS transistor 156 is coupled to the second source/drain terminal of the fourteenth NMOS transistor 155 (and thus also to the second source/drain terminal of the thirteenth NMOS transistor 154).

Moreover, the transistors 151 to 156 of the output circuit 150 are coupled to other elements of the comparator 100 as follows:

a first source/drain terminal of the fifth PMOS transistor 151 is coupled to the positive power supply AVDD during the operation of the comparator 100, a second source/drain terminal of fifteenth NMOS transistor 156 is coupled to the negative power supply AVSS during the operation of the comparator 100, the gate of the sixth PMOS transistor 152 (or equally the gate of the thirteenth NMOS transistor 154) corresponds to (or is coupled to) a positive input terminal of the output circuit 150 (which is, in turn, coupled to the positive output terminal $P_{OUT1}$ of the latch circuit 140), the gate of the seventh PMOS transistor 153 (or equally the gate of the fourteenth NMOS transistor 155) corresponds to (or is coupled to) the negative input terminal of the output circuit 150 (which is, in turn, coupled to the negative output terminal $P_{OUT1}$ of the latch circuit 140) and the second source/drain terminal of the seventh PMOS transistor 153 corresponds to (or is coupled to) an output terminal of the output circuit 150.

During the (nominal) operation of the comparator 100, the first source/drain terminals of the fifth, sixth and seventh PMOS transistors 151, 152, 153 may specifically act as sources and the second source/drain terminals of the fifth, sixth and seventh PMOS transistors 151, 152, 153 may specifically act as drains, as illustrated also in FIG. 1. Further, during the (nominal) operation of the comparator 100, the first source/drain terminals of the thirteenth, fourteenth and fifteenth NMOS transistors 154, 155, 156 may specifically act as drains and the second source/drain terminals of the thirteenth, fourteenth and fifteenth NMOS transistors 154, 155, 156 may specifically act as sources, as illustrated also in FIG. 1.

Finally, the inverter 104 is coupled to the output (terminal) of the output circuit 150 (i.e., to the second and first source/drain terminals of the seventh PMOS and fourteenth NMOS transistors 153, 155, respectively).

In some embodiments, the inverter 104 may be omitted. Thus, in such embodiments, the output of the output circuit 150 corresponds to (or is coupled to) the output of the comparator 100.

It should be appreciated that while FIG. 1 illustrates specific circuit topologies for implementing the plurality of circuits 110, 120, 125, 130, 135, 140, 150 of the comparator 100, in other embodiments, different specific circuit topologies may be employed in the comparator 100 for implementing the same or similar functionalities.

The absolute power consumption of the comparator depends on the current bias levels (I1, I2 and I3) which can be set to a desired level, e.g., to satisfy certain speed requirements. The dynamic power consumption, i.e., the power consumption during transitions, is kept at a low level even when the input signal has a low slew rate. This may be achieved, in particular, by employing an input stage 110 providing positive feedback (and thus hysteresis), first and second current-controlled driver circuits 130, 135 and a latch circuit 140 which may be configured (e.g., by setting transistor sizings appropriately) to guarantee that $N_{OUT}$ and $P_{OUT}$ swing simultaneously, regardless of, e.g., process variation, mismatches, and slew rate of the input signal of the comparator 100.

Figure 2:
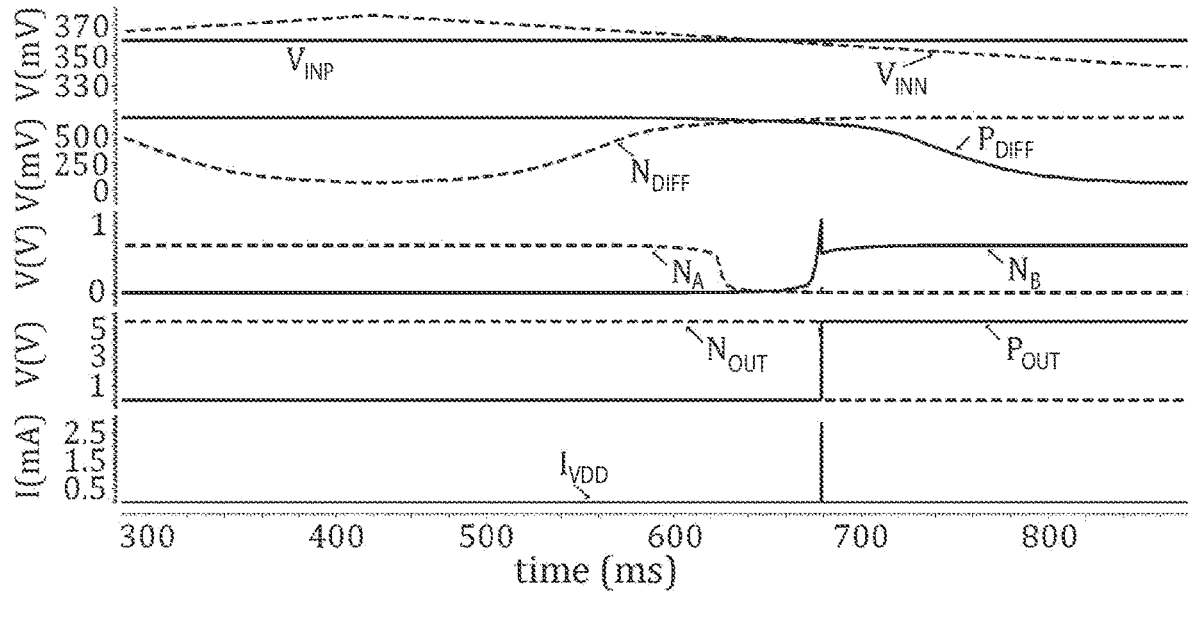
FIG. 2 illustrates exemplary operation of the comparator of FIG. 1.

In the following, the operation of the comparator 100 of FIG. 1 is discussed in detail in reference to FIG. 2. FIG. 2 illustrates the switching of the comparator 100 from one output state to another (equally called toggling of the comparator). Specifically, FIG. 2 illustrates, in the four topmost subfigures, voltages at nodes VINP & VINN, $P_{DIFF}$ & $N_{DIFF}$, $N_A$ & $N_B$ and $P_{OUT}$ and $N_{OUT}$ of the comparator 100 (as indicated in FIG. 1) as a function of time. Moreover, FIG. 2 illustrates, in the bottom subfigure, a current $I_{VDD}$ at the positive power supply (or positive power supply rail) as a function of time. The same time axis is shared by all the subfigures of FIG. 2. In the following, the subfigures of FIG. 2 are called, from the top to the bottom, first, second, third, fourth and fifth subfigures.

Referring to FIG. 2, the positive input signal (i.e., voltage) applied to node VINP is assumed initially to have been set to a certain direct current (DC) threshold, as can be observed from the first subfigure of FIG. 2 (the D C threshold being approx. 350 mV). When voltage at the node VINN starts decreasing at approx. 425 ms and thus approaching the constant voltage at node VINP, the voltage at node $N_{DIFF}$ starts increasing (and $P_{DIFF}$ starts decreasing albeit more slowly), as can be observed from the first and second subfigures of FIG. 2. Since the input circuit 110 of the comparator 100 exhibits internal hysteresis, this process is not symmetrical, i.e., rising of the voltage at $N_{DIFF}$ does not exactly coincide with the falling of the voltage at $P_{DIFF}$ and vice versa, in contrast to, e.g., a resistor or diode-connected-only load. The signals at nodes $P_{DIFF}$ and $N_{DIFF}$ (i.e., the signals outputted by the input circuit 110 of the comparator 120 and shown in the second subfigure of FIG. 2) drive the current mirroring NMOS transistors (121/MN5 and 126/MN6).

In this specific example, the nodes $N_{OUT}$ and $P_{OUT}$ illustrated in the third subfigure of FIG. 2 are initially HIGH (=VDD≠0) and LOW (=0), respectively. The nodes $N_{OUT}$ and $P_{OUT}$ are high-swing nodes that are able to swing from VDD to ground and vice versa. Therefore, initially, the seventh NMOS transistor MN7/131 of the first current-controlled driver circuit 130 is off and the second biasing current source 102 is sunk by the fifth NMOS transistor MN5/121.

When the voltage at node $P_{DIFF}$ is falling, the fifth NMOS transistor MN5/121 is conducting less and less current and, therefore, the current I2 outputted by the second biasing current source 102 starts charging up node $N_B$ (especially after 650 ms in FIG. 2). This charging up of node $N_B$ in turn, causes the ninth NMOS transistor MN9/132 of the second current-controlled driver circuit 130 to gradually draw current from the third PMOS transistor MP3/141 of the latch circuit 140 and thus to pull down the node $N_{OUT}$, as can be observed from the fourth subfigure of FIG. 2 at approx. 658 ms.

On the right-hand side of the input circuit 110, the current I3 (=I2 here) outputted by the third biasing current source 103 is divided between the sixth NMOS transistor MN6/126 and the cascaded eight and tenth NMOS transistors MN8/136 and MN10/137 of the second current-controlled driver circuit 135. The increase in the voltage at node $N_{DIFF}$ causes the sixth NMOS transistor MN6/126 to pull more current causing a decrease in the voltage at node $N_A$, as can be observed from the second and third subfigures of FIG. 2. This, in turn, causes the tenth NMOS transistor MN10/137 to gradually turn off and, thus, letting $P_{OUT}$ to rise, as can be observed from the fourth subfigure of FIG. 2. At this moment, the latch circuit 140 is fed with the proper input for quickly toggling voltages at nodes $N_{OUT}$ and $P_{OUT}$. The high swing signals at nodes $N_{OUT1}$ and $P_{OUT1}$ drive the output circuit 150 (i.e., a current starved inverter) and generate a logic level at the final output.

Regarding the bottom subfigure of FIG. 2, it should be noted that the current $I_{VDD}$ at the positive power supply rail remains at a low value (e.g., at a nanoampere level) equal to a sum of I1, I2 and I3 throughout the toggling process described above, apart from a single extremely narrow peak at the toggling time instance. Thus, it may be concluded from this subfigure that no significant dynamic power consumption issues causing drawing of significant amount of current from VDD exist with the comparator 100 of FIG. 1.

It should be emphasized that internal hysteresis of the input stage 110 and proper mirroring ratio of the first and second current mirrors are important as they ensure that when a (slow) transition signal is applied to the inputs of the comparator 100, voltage at node $N_A$ is forced down before voltage at node $N_B$ rises up. If there would be no hysteresis and/or the mirroring ratio of the first and second current mirrors would not be not high enough, rising of the voltage at node $N_B$ would coincide with the falling of voltage at node $N_A$ (or rising at node $N_B$ happens before the falling at node $N_A$). In such a case, voltage at node $N_{OUT}$ would toggle from a positive supply voltage VDD to the ground while voltage at node $P_{OUT}$ would not be released by the second current-controlled driver circuit 135 to swing from the ground to the positive supply voltage VDD. In other words, voltages at both nodes $N_{OUT}$ and $P_{OUT}$ would be at the ground level or near the ground level which corresponds to high current consumption through the third and fourth PMOS transistors 141, 142 (MP3 & MP4). As a result of this event, a considerable kickback would be generated on node $P_{OUT}$ which would be further transferred to node $N_A$ while trailing. The kickback on node $N_A$ would prevent this node from trailing and therefore the second current-controlled driver circuit 135 would continue to keep node $P_{OUT}$ at low level. As long as this condition persists, a high amount of current would be drawn from the positive power supply AVDD through the latch circuit 140.

It should be noted that the comparator 100 of FIG. 1 could work also without the eleventh and tenth NMOS transistors 143, 144 of the latch circuit 140, i.e., if the CMOS latch circuit would be changed into a PMOS latch circuit. However, this omission would lead to a significant increase in power consumption. Namely, if the eleventh and twelfth NMOS transistors 143, 144 are omitted in the case in which voltage at node $N_A$ is trailing before voltage at node $N_B$ (which is desirable for the provided example operation), the second current-controlled driver circuit 135 turns off before the toggling moment and therefore node POUT is floating. The reason for this operation is that the fourth PMOS transistor 142 (MP4) is off at this moment, and nothing else is limiting node POUT to any particular voltage level. If the transition time is long, leakages at node POUT cause voltage at node POUT to rise gradually from ground level to a voltage which is large enough for the transistors 151 to 156 (MP5-MP6 & MN13-MN15) of the next inverter stage 150 to conduct current from the positive power supply VDD. The inclusion of the eleventh and twelfth NMOS transistors 143, 144 (MN11 & MN12) solves this issue. These two transistors 143, 144 keep the LOW side (POUT in the illustrated example) at the ground level until the toggle time arrives.

Figure 3:
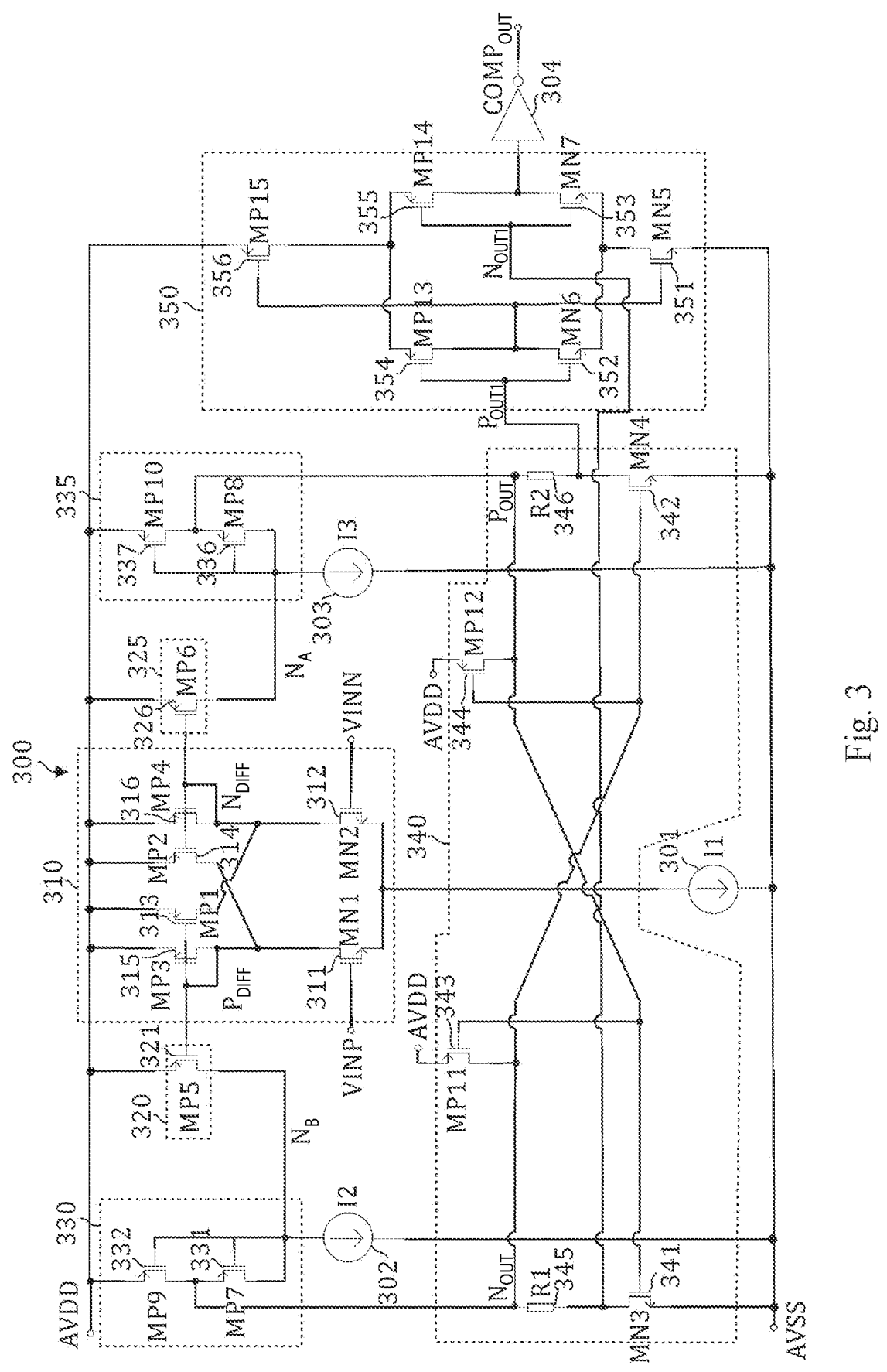
FIG. 3 illustrates a comparator according to embodiments.

FIG. 3 illustrates another comparator 300 according to an embodiment for providing low power consumption. The comparator 300 may be specifically a MOSFET-based comparator (though, in other embodiments, different transistor technology may be employed).

The comparator 300 is a complementary implementation to the comparator 100 of FIG. 1. In other words, the comparator 300 corresponds to the comparator 100 of FIG. 1 with the PMOS transistors replaced with NMOS transistors, NMOS transistors replaced with PMOS transistors and sinking currents replaced with sourcing currents. Specifically, the circuits (or stages) 310, 320, 325, 330, 335, 340, 350 of FIG. 3 may be complementary circuits to circuits (or stages) 110, 120, 125, 130, 135, 140, 150 of FIG. 1, respectively. Specifically, the MOS transistors 311 to 316, 321, 326, 331, 332, 336, 337, 341 to 344, 351 to 356 of FIG. 3 are complementary to MOS transistors 111 to 116, 121, 126, 131, 132, 136, 137, 141 to 144, 151 to 156 of FIG. 1, respectively.

As a consequence of the complementary nature of the comparators 100, 300 of FIGS. 1 and 3, the above discussion of the comparator 100 of FIG. 1 applies, mutatis mutandis (i.e., taking into account the complementary nature of the comparator 300 relative the comparator 100), for the comparator 300. Nevertheless, the composition and operation of the comparator 300 is described in the following, albeit briefly.

For facilitating reading of the following description of the comparator 300 of FIG. 3, it should be noted that, in the following, first and second source/drain terminals of any transistor correspond, respectively, to bottom and top source/drain terminals as shown in FIG. 3.

Similar to the comparator 100 of FIG. 1, the comparator 300 of FIG. 3 comprises:

positive and negative input terminals (VINP & VINN);

first, second and third biasing current sources 301, 302, 303 configured to output first, second and third biasing currents (I1, I2 & I3);

an input circuit 310 driven by the first biasing current source 301, wherein the input circuit 310 comprises an amplification circuit (comprising first and second NMOS transistors 311, 312) coupled to the positive and negative input terminals and a load circuit (comprising first and second PMOS transistors 313, 314 and third and fourth NMOS transistors 315, 316) configured to provide positive feedback for the amplification circuit to enable hysteresis;

first and second current mirroring circuits 320, 325 for forming, with the input circuit (or specifically with elements 315, 316), first and second current mirrors producing first and second current mode signals;

first and second current-controlled driver circuits 330, 335 configured to be controlled by the second and third biasing currents (I2 & I3), respectively, and further by the first and second current mode signals, respectively;

a latch circuit 340 comprising first and second cross-coupled CMOS transistors acting together as a latch having substantially rail-to-rail output voltage swing and being driven, respectively, by the first and second current-controlled driver circuits 330, 335; and an output circuit 350 implementing a current starved inverter for limiting a shoot-through current from a positive power supply to a negative power supply, wherein positive and negative inputs of the output circuit 350 are coupled, respectively, to output terminals of the latch circuit 340.

In some embodiments as illustrated in FIG. 3, the first and second current mirroring circuits 320, 325 employ the same circuit topology and the first and second current-controlled driver circuits 330, 335 employ the same circuit topology.

In some embodiments, the load circuit (of the input circuit 310) comprises first and second load transistors 313, 314 cross-coupled to the amplification circuit (of the input circuit 310) and first and second diode-connected transistors 315, 316 arranged, respectively, in parallel with the first and second cross-coupled load transistors 313, 314, the first and second current mirrors being formed by the first and second mirroring circuits 320, 325 in combination with the first and second diode-connected transistors 315, 316, respectively.

In some embodiments, the amplification circuit of the input circuit 310 comprises:

first and second NMOS transistors 311, 312, wherein gates of the first and second NMOS transistors 311, 312 are coupled, respectively, to the positive and negative inputs (VINP & VINN) and first source/drain terminals of the first and second NMOS transistors 311, 312 are coupled to the first biasing current source 301.

In some embodiments, the load circuit of the input circuit 310 comprises:

first and second PMOS transistors 313, 314 (equally called first and second load transistors), wherein gates of the first and second PMOS transistors 313, 314 correspond to the positive and negative output terminals of the input circuit 310 and the first source/drain terminals of the first and second PMOS transistors 313, 314 are coupled, respectively, to second source/drain terminals of the second and first NMOS transistors 312, 311; and third and fourth PMOS transistors 315, 316 (equally called first and second diode-connected transistors), wherein gates of the third and fourth PMOS transistors 315, 316 are coupled, respectively, to first source/drain terminals of the third and fourth PMOS transistors 315, 316 and to the gates of the first and second PMOS transistors 313, 314, the first and second current mirrors being formed by the first and second mirroring circuits

320, 325 in combination with the third and fourth PMOS transistors 315, 316, respectively.

In some embodiments, first and second current mirroring circuits 320, 325 comprise, respectively, fifth and sixth PMOS transistors 321, 326 for producing, respectively, the first and second current mode signals, where gates of the fifth and sixth PMOS transistors 321, 326 are coupled, respectively, to the positive and negative output terminals of the input circuit 310.

In some embodiments, the first current-controlled driver circuit 330 comprises:

seventh and ninth PMOS transistors 331, 332 forming a cascade, wherein gates of the seventh and ninth PMOS 331,332 transistors are both coupled to a first source/drain terminal of the fifth PMOS transistor 321 providing the first current mode signal, to a first source/drain terminal of the seventh PMOS transistor 331 and to the second biasing current source 302 and a second source/drain terminal of the seventh PMOS transistor 331 and a first source/drain terminal of the ninth PMOS transistor 332 are coupled to each other and correspond to an output terminal of the first current-controlled driver circuit 330.

In some embodiments, the second current-controlled driver circuit 335 comprises:

eighth and tenth PMOS transistors 336, 337 forming a cascade, wherein gates of the eighth and tenth PMOS transistors 336, 337 are both coupled to a first source/drain terminal of the sixth PMOS transistor 326 providing the second current mode signal, to a first source/drain terminal of the eighth PMOS transistor 336 and to the third biasing current source 303 and a second source/drain terminal of the eighth PMOS transistor 336 and a first source/drain terminal of the tenth PMOS transistor 337 are coupled to each other and correspond to an output terminal of the second current-controlled driver circuit 335.

In some embodiments, the first and second cross-coupled CMOS transistors of the latch circuit 340 are coupled, respectively, to the output terminals of the first and second current-controlled driver circuits 330, 335.

In some embodiments, the latch circuit 340 comprises:

third and fourth NMOS transistors 341, 342, wherein gates of the third and fourth NMOS transistors 341, 342 are coupled, respectively, to output terminals of the first and second current-controlled driver circuits 330, 335 and to second source/drain terminals of the fourth and third NMOS transistors 342, 341 and the second source/drain terminals of the third and fourth NMOS transistors 341, 342 correspond, respectively, to negative and positive output terminals of the latch circuit 340; and eleventh and twelfth PMOS transistors 343, 344, wherein gates of the eleventh and twelfth PMOS transistors 343, 344 are coupled, respectively, to the gates of the third and fourth NMOS transistors 341, 342 and to first source/drain terminals of the twelfth and eleventh PMOS transistors 344, 343.

In some embodiments, the latch circuit 340 comprises:

first and second resistors 345, 346;

third and fourth NMOS transistors 341, 342, wherein gates of the third and fourth NMOS transistors 341, 342 are coupled, respectively, to output terminals of the first and second current-controlled driver circuits 330, 335 and, respectively, via the first and second resistors 345, 346 to second source/drain terminals of the fourth and third NMOS transistors 342, 341 and the second source/drain terminals of the third and fourth NMOS transistors correspond 341, 342, respectively, to negative and positive output terminals of the latch circuit 340; and eleventh and twelfth PMOS transistors 343, 344, wherein gates of the eleventh and twelfth PMOS transistors 343, 344 are coupled, respectively, to the gates of the third and fourth NMOS transistors 341, 342 and to first source/drain terminals of the twelfth and eleventh PMOS transistors 344, 343.

In some embodiments, the first and second resistors 345, 346 have equal resistance values.

In some embodiments, the output circuit 350 comprises:

a fifth NMOS transistor 351, wherein a first source/drain terminal of the fifth NMOS transistor 351 is for coupling to the negative power supply (AVSS);

a sixth NMOS transistor 352, wherein a gate of the sixth NMOS transistor 352 corresponds to the positive input ($P_{OUT1}$) of the output circuit 350, a first source/drain terminal of the sixth NMOS transistor 352 is coupled to a second source/drain terminal of the fifth NMOS transistor 352 and a second source/drain terminal of the sixth NMOS transistor 352 is coupled to a gate of the fifth NMOS transistor 351;

a seventh NMOS transistor 353, wherein a gate of the seventh NMOS transistor 353 corresponds to the negative input ($N_{OUT1}$) of the output circuit 350, a first source/drain terminal of the seventh NMOS transistor 353 is coupled to the second source/drain terminal of the fifth NMOS transistor 351 and a second source/drain terminal of the seventh NMOS transistor 353 corresponds to an output terminal of the output circuit 350;

a thirteenth PMOS transistor 354, wherein a gate of the thirteenth PMOS transistor 354 corresponds to the positive input ($P_{OUT1}$) of the output circuit 350 and a first source/drain terminal of thirteenth PMOS transistor 354 is coupled to the second source/drain terminal of the sixth NMOS transistor 352;

a fourteenth PMOS transistor 355, wherein a gate of the fourteenth PMOS transistor 355 corresponds to the negative input ($N_{OUT1}$) of the output circuit 350, a first source/drain terminal of fourteenth PMOS transistor 355 is coupled to the second source/drain terminal of the seventh NMOS transistor 353 and a second source/drain terminal of fourteenth PMOS transistor 355 is coupled to a second source/drain terminal of the thirteenth PMOS transistor 354; and a fifteenth PMOS transistor 356, wherein a gate of the fifteenth PMOS transistor 356 is coupled to the gate of the fifth NMOS transistor 351, a first source/drain terminal of fifteenth PMOS transistor 356 is coupled to the second source/drain terminal of the fourteenth PMOS transistor 355 and a second source/drain terminal of the fifteenth PMOS transistor 356 is for coupling to the positive power supply (AVDD).

In some embodiments, the comparator 300 comprises an inverter 304 coupled to an output terminal of the output circuit 350.

In some embodiments, the second and third biasing current sources (I2 & I3) are configured to output equal biasing currents.

In the following, the operation of the comparator 300 discussed briefly. Suppose that a (slow) rising signal is applied to node VINN while node VINP is kept as a DC level. In this case, voltage at $N_{DIFF}$ falls while voltage at $P_{DIFF}$ rises (considering the effect of input stage positive feedback and internal hysteresis). Rising of $P_{DIFF}$ forces node $N_B$ to drop and, as a result, the ninth PMOS transistor MP9 332 gradually turns on and pulls voltage at node $N_{OUT}$ (and $N_{OUT1}$) up. At the same time, falling of the voltage at $N_{DIFF}$ forces voltage at node $N_A$ to rise, as a result of which the tenth PMOS transistor MP10 337 turns off and node $P_{OUT}$ is released to be pulled down by the latch circuit 340 to ground. Consequently, the toggling event by the latch circuit 340 propagates to the output through the output circuit 350 and the output $COMP_{OUT}$ toggles. In this case, it is important that $N_A$ rises before $N_B$ falls so that, at the toggling moment, node $P_{OUT}$ is ready to be pulled down by the latch circuit 340.

The comparators according to embodiments provide the benefit of low power consumption even in the cases where input transitions are slow (i.e., the slew rate of the input signals is low). The comparators according to embodiments may be optimized for a given desired input slew rate. This way the dynamic power consumption of the comparator may be maintained at a low level while not significantly affecting the other fundamental characteristics of the comparator (i.e., speed, delay and/or output rise time).

The comparators according to embodiments providing low power consumption may be used in a variety of applications where it is critical to minimize power consumption of an electrical device. For example, in an embodiment, a DC-DC converter comprising at least one comparator as described above may be provided. The use of the comparator in a DC-DC converter may be especially beneficial for DC-DC converters configured to operate using a low-power or an ultra-low-power mode in which it is critical to minimize power consumption.

Embodiments described herein are applicable to systems defined above but also to other systems. The specifications of the systems and their elements develop rapidly. Such development may require extra changes to the described embodiments. Therefore, all words and expressions should be interpreted broadly and they are intended to illustrate, not to restrict, the embodiment. It will be obvious to a person skilled in the art that, as technology advances, the inventive concept can be implemented in various ways. Embodiments are not limited to the examples described above but may vary within the scope of the claims.

The invention claimed is:

1. A comparator comprising:
positive and negative input terminals;
first, second and third biasing current sources configured to output first, second and third biasing currents;
an input circuit driven by the first biasing current source, wherein the input circuit comprises an amplification circuit coupled to the positive and negative input terminals and a load circuit configured to provide positive feedback for the amplification circuit to enable hysteresis;
first and second current mirroring circuits for forming, with the input circuit, first and second current mirrors producing first and second current mode signals;
first and second current-controlled driver circuits configured to be controlled by the second and third biasing currents, respectively, and further by the first and second current mode signals, respectively;
a latch circuit comprising first and second cross-coupled complementary metal-oxide semiconductor, CMOS, transistors acting together as a latch having substantially rail-to-rail output voltage swing and being driven, respectively, by the first and second current-controlled driver circuits; and an output circuit implementing a current starved inverter for limiting a shoot-through current from a positive power supply to a negative power supply, wherein positive and negative inputs of the output circuit are coupled, respectively, to output terminals of the latch circuit.

2. The comparator of claim 1, wherein first and second current mirroring circuits employ the same circuit topology and the first and second current-controlled driver circuits employ the same circuit topology.

3. The comparator of claim 1, wherein the load circuit comprises first and second load transistors cross-coupled to the amplification circuit and first and second diode-connected transistors arranged, respectively, in parallel with the first and second cross-coupled load transistors, the first and second current mirrors being formed by the first and second mirroring circuits in combination with the first and second diode-connected transistors, respectively.

4. The comparator of claim 1, wherein the amplification circuit of the input circuit comprises:
first and second PMOS transistors, wherein gates of the first and second PMOS transistors are coupled, respectively, to the positive and negative inputs and first source/drain terminals of the first and second PMOS transistors are coupled to the first biasing current source,
wherein the load circuit of the input circuit comprises:
first and second NMOS transistors, wherein gates of the first and second NMOS transistors correspond to the positive and negative output terminals of the input circuit and the first source/drain terminals of the first and second NMOS transistors are coupled, respectively, to second source/drain terminals of the second and first PMOS transistors; and
third and fourth NMOS transistors, wherein gates of the third and fourth NMOS transistors are coupled, respectively, to first source/drain terminals of the third and fourth NMOS transistors and to the gates of the first and second NMOS transistors, the first and second current mirrors being formed by the first and second mirroring circuits in combination with the third and fourth NMOS transistors, respectively.

5. The comparator according to claim 1, wherein the first and second current mirroring circuits comprise, respectively, fifth and sixth n-type metal-oxide-semiconductor, NMOS, transistors for producing, respectively, the first and second current mode signals, wherein gates of the fifth and sixth NMOS transistors are coupled, respectively, to the positive and negative output terminals of the input circuit.

6. The comparator of claim 5, wherein the first current-controlled driver circuit comprises:
seventh and ninth NMOS transistors forming a cascade, wherein gates of the seventh and ninth NMOS transistors are both coupled to a first source/drain terminal of the fifth NMOS transistor providing the first current mode signal, to a first source/drain terminal of the seventh NMOS transistor and to the second biasing current source and a second source/drain terminal of the seventh NMOS transistor and a first source/drain terminal of the ninth NMOS transistor are coupled to each other and correspond to an output terminal of the first current-controlled driver circuit,
wherein the second current-controlled driver circuit comprises:
eighth and tenth NMOS transistors forming a cascade, wherein gates of the eighth and tenth NMOS transistors are both coupled to a first source/drain terminal of the sixth NMOS transistor providing the second current mode signal, to a first source/drain terminal of the eighth NMOS transistor and to the third biasing current source and a second source/drain terminal of the eighth NMOS transistor and a first source/drain terminal of the tenth NMOS transistor are coupled to each other and correspond to an output terminal of the second current-controlled driver circuit.

7. The comparator according to claim 6, wherein the first and second cross-coupled CMOS transistors of the latch circuit are coupled, respectively, to the output terminals of the first and second current-controlled driver circuits.

8. The comparator according to claim 1, wherein the latch circuit comprises:

third and fourth PMOS transistors, wherein gates of the third and fourth PMOS transistors are coupled, respectively, to output terminals of the first and second current-controlled driver circuits and to second source/drain terminals of the fourth and third PMOS transistors and the second source/drain terminals of the third and fourth PMOS transistors correspond, respectively, to negative and positive output terminals of the latch circuit; and eleventh and twelfth NMOS transistors, wherein gates of the eleventh and twelfth NMOS transistors are coupled, respectively, to the gates of the third and fourth PMOS transistors and to first source/drain terminals of the twelfth and eleventh NMOS transistors.

9. The comparator according to claim 1, wherein the latch circuit comprises:

first and second resistors;

third and fourth PMOS transistors, wherein gates of the third and fourth PMOS transistors are coupled, respectively, to output terminals of the first and second current-controlled driver circuits and, respectively, via the first and second resistors to second source/drain terminals of the fourth and third PMOS transistors and the second source/drain terminals of the third and fourth PMOS transistors correspond, respectively, to negative and positive output terminals of the latch circuit; and eleventh and twelfth NMOS transistors, wherein gates of the eleventh and twelfth NMOS transistors are coupled, respectively, to the gates of the third and fourth PMOS transistors and to first source/drain terminals of the twelfth and eleventh NMOS transistors.

10. The comparator according to claim 8, wherein the first and second resistors have equal resistance values.

11. The comparator according to claim 1, wherein the output circuit comprises:

a fifth PMOS transistor, wherein a first source/drain terminal of the fifth PMOS transistor is for coupling to the positive power supply;

a sixth PMOS transistor, wherein a gate of the sixth PMOS transistor corresponds to the positive input of the output circuit, a first source/drain terminal of the sixth PMOS transistor is coupled to a second source/drain terminal of the fifth PMOS transistor and a second source/drain terminal of the sixth PMOS transistor is coupled to a gate of the fifth PMOS transistor;

a seventh PMOS transistor, wherein a gate of the seventh PMOS transistor corresponds to the negative input of the output circuit, a first source/drain terminal of the seventh PMOS transistor is coupled to the second source/drain terminal of the fifth PMOS transistor and a second source/drain terminal of the seventh PMOS transistor corresponds to an output terminal of the output circuit;

a thirteenth NMOS transistor, wherein a gate of the thirteenth NMOS transistor corresponds to the positive input of the output circuit and a first source/drain terminal of thirteenth NMOS transistor is coupled to the second source/drain terminal of the sixth PMOS transistor;

a fourteenth NMOS transistor, wherein a gate of the fourteenth NMOS transistor corresponds to the negative input of the output circuit, a first source/drain terminal of fourteenth NMOS transistor is coupled to the second source/drain terminal of the seventh PMOS transistor and a second source/drain terminal of fourteenth NMOS transistor is coupled to a second source/drain terminal of the thirteenth NMOS transistor; and a fifteenth NMOS transistor, wherein a gate of the fifteenth NMOS transistor is coupled to the gate of the fifth PMOS transistor, a first source/drain terminal of fifteenth NMOS transistor is coupled to the second source/drain terminal of the fourteenth NMOS transistor and a second source/drain terminal of the fifteenth NMOS transistor is for coupling to the negative power supply.

12. The comparator according to claim 1, further comprising:

an inverter coupled to an output terminal of the output circuit.

13. The comparator according to claim 1, wherein the second and third biasing current sources are configured to output equal biasing currents.

14. A direct current to direct current, DC-DC, converter comprising at least one comparator, the at least one comparator further comprising positive and negative input terminals;

first, second and third biasing current sources configured to output first, second and third biasing currents;

an input circuit driven by the first biasing current source, wherein the input circuit comprises an amplification circuit coupled to the positive and negative input terminals and a load circuit configured to provide positive feedback for the amplification circuit to enable hysteresis;

first and second current mirroring circuits for forming, with the input circuit, first and second current mirrors producing first and second current mode signals;

first and second current-controlled driver circuits configured to be controlled by the second and third biasing currents, respectively, and further by the first and second current mode signals, respectively;

a latch circuit comprising first and second cross-coupled complementary metal-oxide semiconductor, CMOS, transistors acting together as a latch having substantially rail-to-rail output voltage swing and being driven, respectively, by the first and second current-controlled driver circuits; and an output circuit implementing a current starved inverter for limiting a shoot-through current from a positive power supply to a negative power supply, wherein positive and negative inputs of the output circuit are coupled, respectively, to output terminals of the latch circuit.

* * * * *